(12) United States Patent
Lee et al.

(10) Patent No.: US 6,184,095 B1
(45) Date of Patent: Feb. 6, 2001

(54) METHOD FOR FABRICATING MASK ROM VIA MEDIUM CURRENT IMPLANTER

(75) Inventors: Chen-Jui Lee; Min-Hsiu Chen, both of Hsinchu (TW)

(73) Assignee: Windbond Electronics Corp., Hsinchu (TW)

( * ) Notice: Under 35 U.S.C. 154(b), the term of this patent shall be extended for 0 days.

(21) Appl. No.: 09/247,746

(22) Filed: Feb. 9, 1999

(51) Int. Cl.$^7$ ................................................ H01L 21/8236
(52) U.S. Cl. ............................................ 438/278; 438/276
(58) Field of Search .................................... 438/275, 276, 438/278, 277

(56) References Cited

U.S. PATENT DOCUMENTS 5,350,703   9/1994   Lee .
5,665,995 * 9/1997   Hsue et al. ............................ 257/390

* cited by examiner

Primary Examiner—Charles Bowers
Assistant Examiner—Jack Chen

(74) Attorney, Agent, or Firm—Majestic, Parsons, Siebert & Hsue, P.C.

(57) ABSTRACT

A method is provided to fabricate a mask ROM device via a medium current implanter. For fabricating the mask ROM device, first, formation of an array of MOS transistors on a semiconductor substrate is achieved. Each of the MOS transistors includes a gate oxide film, a gate electrode, a source region and a drain region. After the formation of the array of transistors, a USG layer, a BPSG layer, metal electrodes and a passivation layer are sequentially formed. After an order from client, an etching back process is performed to remove selected portions of the passivation layer to form openings in accordance with a ROM code. The selected portions are located over the selected gate electrodes respectively. The portions of the BPSG layer within the openings are successively etched until the remained BPSG layer is in a predetermined thickness. Finally, ROM code ions are implanted into the substrate via a medium current implanter through the openings. The remained thickness of the etched-back BPSG layer within the openings is employed to form the code identification on the substrate. The method has the advantages of short turn around time and low fabrication cost.

3 Claims, 4 Drawing Sheets

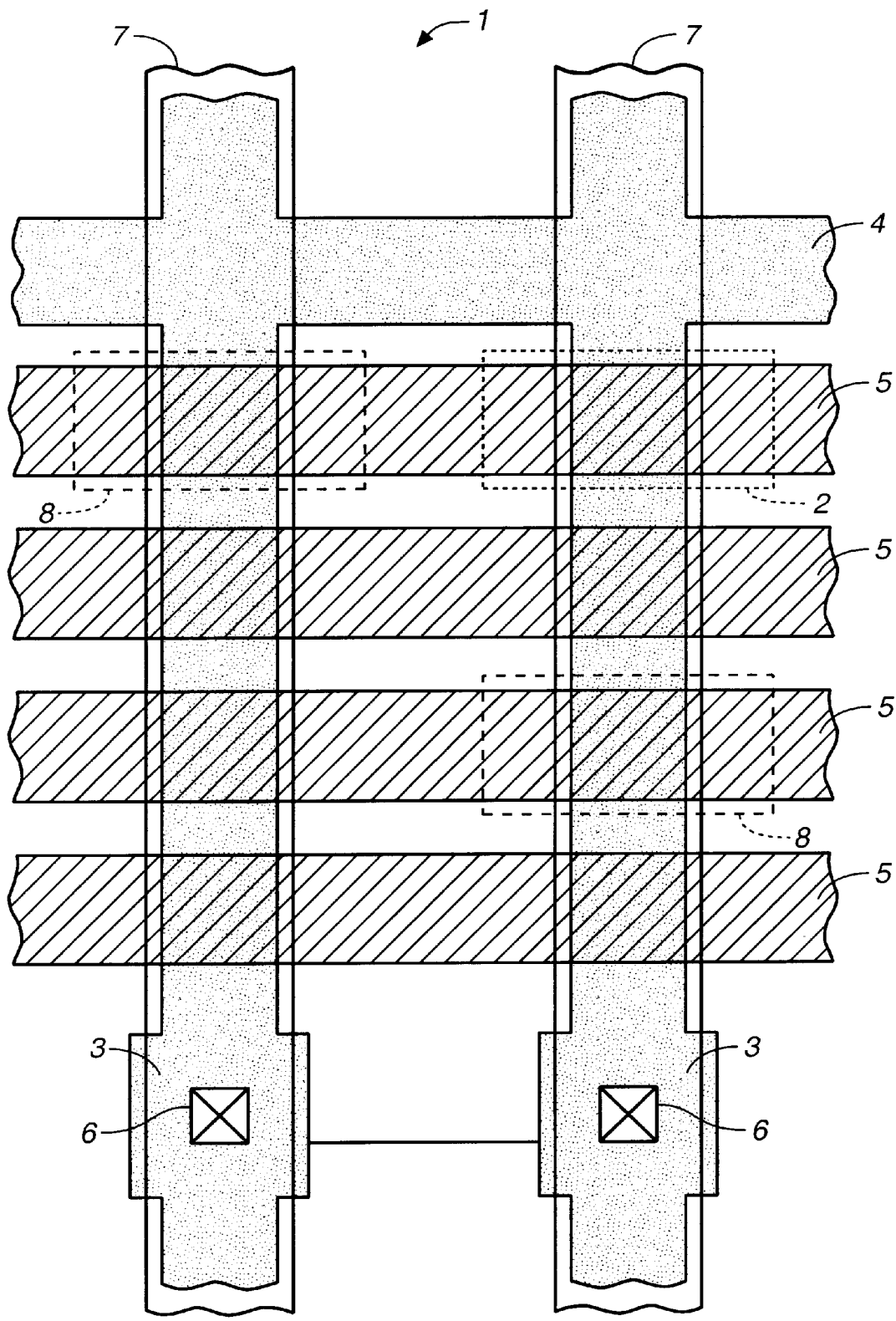
FIG._1A
*(PRIOR ART)*

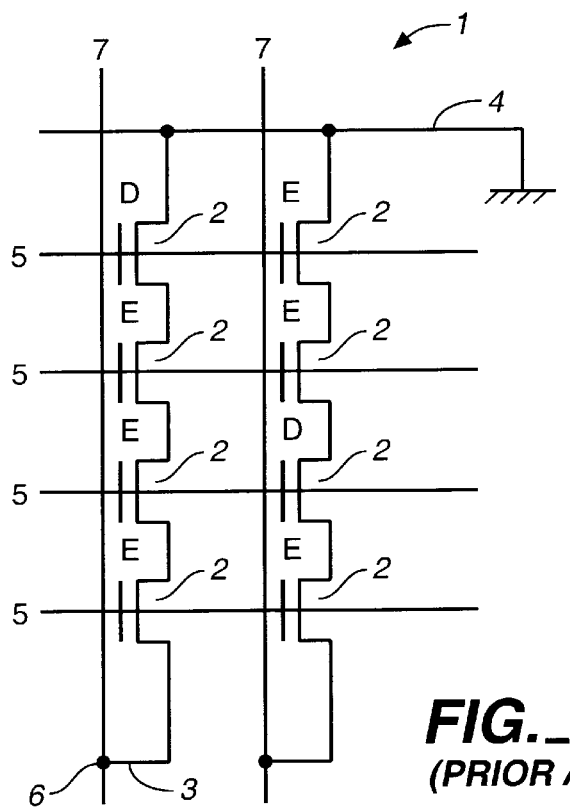
FIG._1B
*(PRIOR ART)*
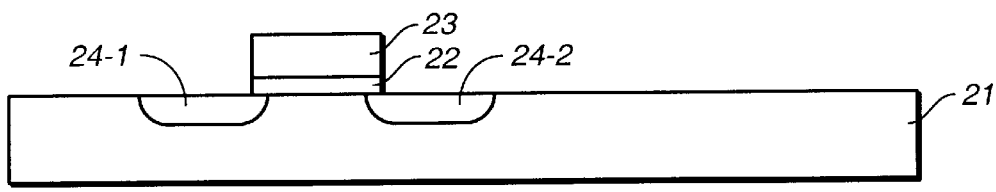
FIG._2A
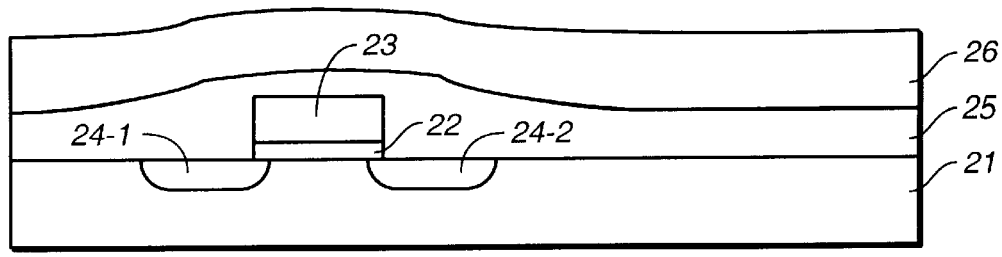
FIG._2B

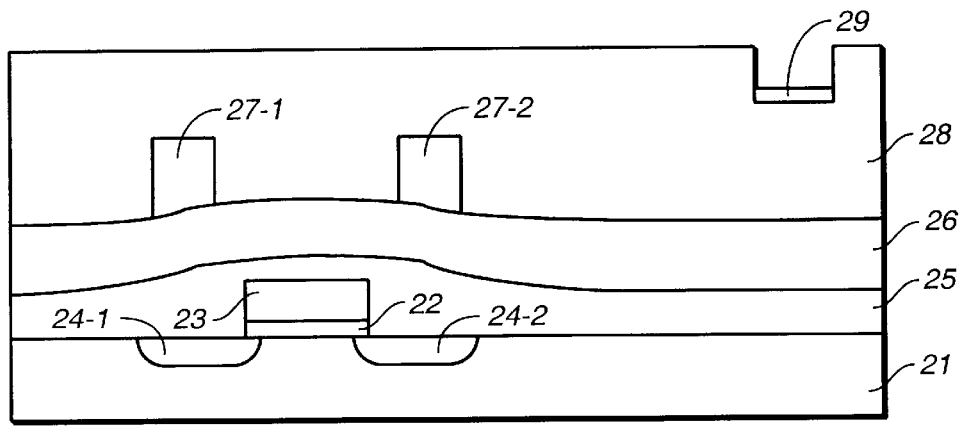
FIG._2C
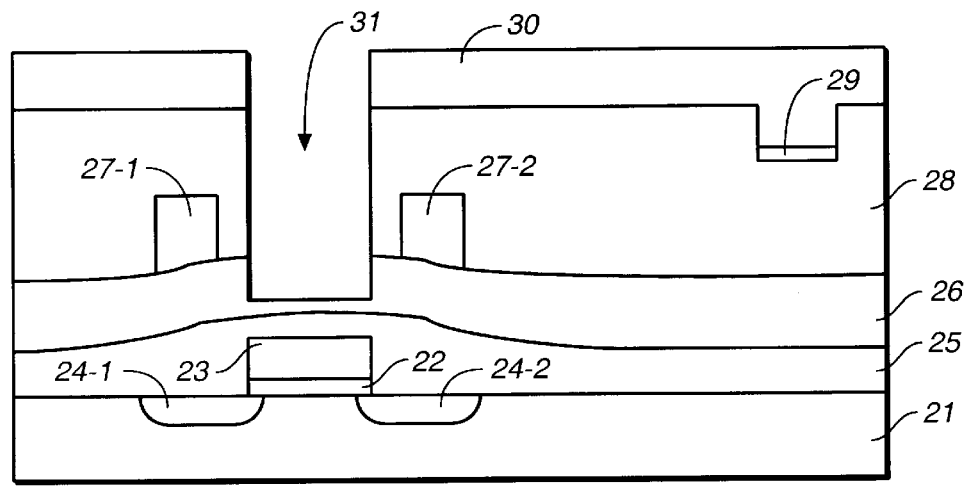
FIG._2D
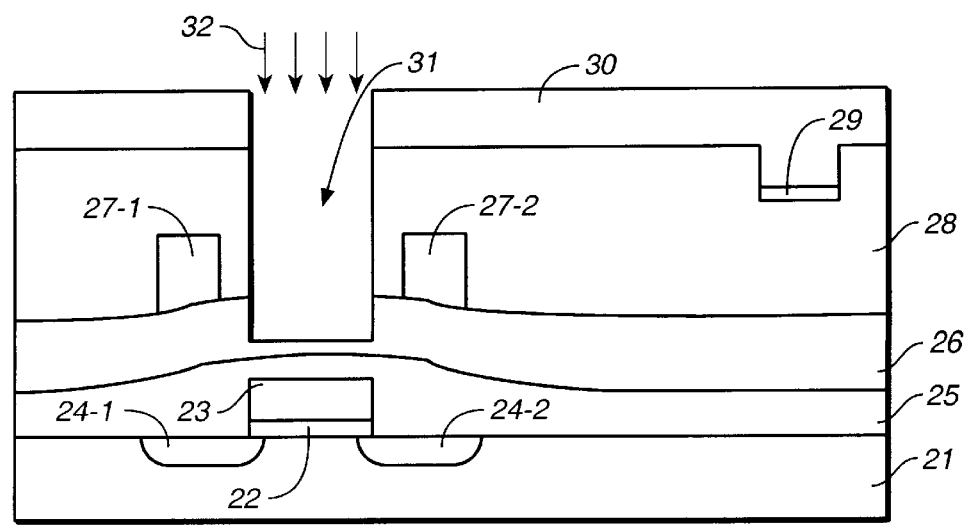
FIG._2E

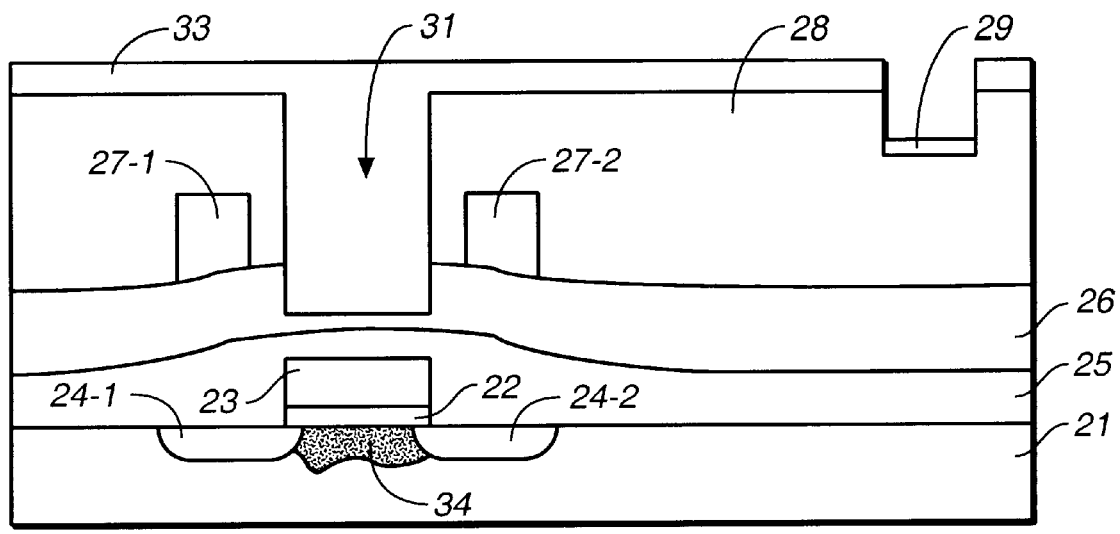
FIG._2F
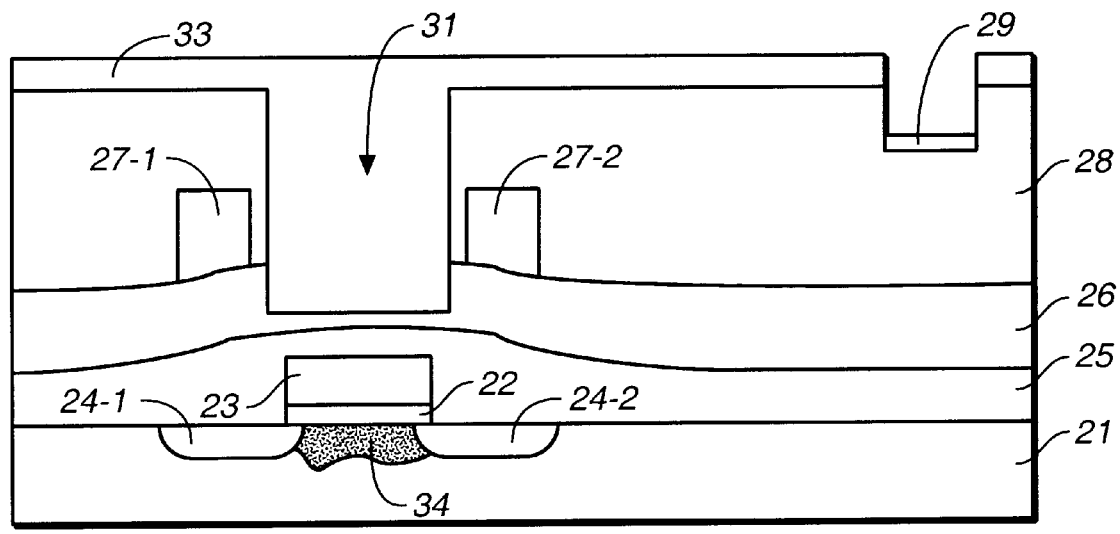
FIG._3

METHOD FOR FABRICATING MASK ROM VIA MEDIUM CURRENT IMPLANTER

FIELD OF INVENTION

The invention relates to a method for fabricating a mask read only memory (ROM) and, in particular, to a method for fabricating a mask ROM by implanting ROM code ions via a medium current implanter.

BACKGROUND OF INVENTION

Mask ROMs (MROMs) are widely used memory devices capable of storing permanently information. MROMs are a kind of non-volatile memory device in which stored information is not erased even if the applied electric power is removed. MROMs are mainly classified into NOR type MROMs and NAND type MROMs as defined by the circuit structure of the memory cell which is used in the device.

MROMs in which data ordered by client is written by use of a mask in a fabrication process have several advantages. First, MROMs have a simplex circuit construction in which no separate data writing circuit is required. Second, MROMs require only a simplex fabrication in which used memory cell structure requires no specific fabrication process. Third, MROMs are capable of providing various memory cell systems from which an appropriate one can be selected according to the use intended.

A widely used method for writing data into MROMs is an ion implantation method. This method performs writing of information for MROMs by use of ion implantation. FIGS. 1A and 1B are schematic and pictorial views respectively illustrating a memory cell array 1 in a typical MROM of the ion implantation type. FIG. 1A is a plan view of a layout of the memory cell array 1. FIG. 1B is a circuit diagram illustrating an equivalent circuit of the memory cell array 1.

In FIG. 1A, a region 2 surrounded by the dotted line represents one of a plurality of memory cells arranged in matrix manner in the memory cell array 1. Each memory cell 2 is realized by either an N type or a P type MOS transistor.

The MROM shown in FIG. 1A is of the ion implantation type, in which a region 8 surrounded by the dashed line corresponds to an impurity-implanted region formed at a channel region of a MOS transistor.

In this case, the memory cell array 1 includes the MOS transistors which each has an impurity-implanted region 8 and others which each has no impurity-implanted region 8. The MOS transistors having the impurity-implanted region 8 become transistors operating in the depletion mode corresponding to the level "1" of information. Opposite, the MOS transistors having no impurity-implanted region 8 become transistors operating in the enhancement mode corresponding to the level "0" of information.

In an MROM of the ion implantation type, the process of implanting ROM code ions must be performed after an order from client. Therefore, there is a turn around time in the fabrication of an MROM when manufacturer takes to fabricate the MROM after an order from client. Early, the process of implanting ROM code ions is performed after the formation of MOS transistors. Afterward, the successive processes are performed to complete the MROM. This results in a low productivity due to very long turn around time.

To date, a post-passivation MROM programming method, in which the process of implanting ROM code ions is performed after the formation of passivation layer, is widely applied. The improved method significantly reduces the turn around time when fabricating an MROM. However, in the method, a high current implanter is required to implant ROM code ions into semiconductor substrate through a thickness of more than 10,000 Å. It is evident that the cost of fabricating MROMs increases due to the requirement of expensive equipment. Besides, the ROM code ions with high energy (more than 500 keV) probably introduces deleterious effects into ROM devices.

U.S. Pat. No. 5,350,703 provides a method for fabricating an MROM device first by etching back partially an array of passivated MOS transistors to expose selected gate electrodes and then by implanting ROM code ions into the employed substrate to complete the information storage of ROM. However, in practical application, the fabrication method (etching back method) is difficult for manufacturers to control the etching stop point without excessive etching back. So the etching back method would cause the damage of selected transistors.

Accordingly, an objective of the invention is to fabricate post-passivation MROMs via a medium current implanter. By use of a medium current implanter, the invention reduces the cost and deleterious effects for fabricating post-passivation MROMs.

Another objective of the invention is to employ an etching back method to directly form a ROM code pattern on an array of passivated MOS transistors without the damage of selected transistors.

SUMMARY OF INVENTION

An objective of the invention is provided a method for fabricating a post-passivation programmed MROM via a medium current implanter. The inventive method is capable of shortening turn around time and enhancing productivity without the need to add expensive equipment.

A ROM code pattern is directly formed on an array of passivated MOS transistors, in the invention. The array of passivated MOS transistors is employed in an etching back process to form openings in accordance with a ROM code. The resultant structure is identified as the ROM code pattern. The ROM code ions are successfully implanted into the substrate through the openings via a medium current implanter.

According to this invention, for fabricating an NROM device, the formation of an array of MOS transistors on a semiconductor substrate is achieved. In the array of MOS transistors, a MOS transistor includes a gate oxide film, a gate electrode, a source region and a drain region. A silicon glass layer, metal electrodes and a passivation layer are sequentially formed over the array of MOS transistors. After an order from client, an etching back process is performed to remove selected portions of the passivation layer to form openings in accordance with a ROM code. The selected portions are located over the selected gate electrodes respectively. The portions of the silicon glass layer within the openings are successively etched until the remained silicon glass layer is in a predetermined thickness. ROM code ions are implanted into the substrate via a medium current implanter. The remained thickness of the etched-back silicon glass layer within the openings is employed to form the code identification on the substrate. Therefore, for fabricating the MROM, the ROM code pattern is directly formed on the passivated array of MOS transistors without the need to form another mask.

In a preferred embodiment of the invention, the remained thickness of the etched-back BPSG layer within the openings is set within a range of about 1,500 Å to 2,000 Å. The thickness of the USG layer underlying the etched-back BPSG layer within the openings is set within a range of about 1,500 Å to 2,000 Å. In this case, the P+ type of ROM code ions are successfully implanted into the substrate via the medium current implanter operating at an energy level of about 100 keV to 150 keV. Alternatively, the N+ type of ROM code ions are successfully implanted into the substrate via the medium current implanter operating at an energy level of about 250 keV to 360 keV. The medium current implanter is operated normally in the energy level of 100 keV to 360 keV. Thereby, the structure with openings mentioned above can be identified as a ROM code pattern, and the ROM code ions can be successfully implanted into the substrate through the openings and the glass layers within the openings.

BRIEF DESCRIPTION OF THE APPENDED DRAWINGS

FIG. 1A is a plane view of a conventional ion implanted MROM of the NAND type.

FIG. 1B is a circuit diagram of an equivalent circuit of the MROM shown in FIG. 1A.

FIGS. 2A to 2F are schematic sectional views illustrating a method for fabricating an MROM in accordance with the first embodiment of the invention.

FIG. 3 is schematic sectional view illustrating a method for fabricating an MROM in accordance with the second embodiment of the invention.

DETAILED DESCRIPTION OF THE INVENTION

The invention provides a method for fabricating an MROM device via a medium current implanter. The inventive method mainly includes a first process performed before an order from client and a second process performed after the order from client.

The first process is that of forming an array of passivated MOS transistors (memory cells) on a semiconductor substrate. In the first process, first, the array of MOS transistors on the semiconductor substrate, which each MOS transistor includes a gate oxide film, a gate electrode, a source region and a drain region, is achieved. After the formation of the array of MOS transistors, a silicon glass layer, metal electrodes, a passivation layer and bond pads of the device that provide connection with an outer circuit are sequentially formed.

The second process is that of forming a ROM code pattern on the previously passivated MOS transistors and then implanting ROM code ions into the substrate. FIG. 2A through FIG. 2F illustrate an MROM fabricating method in accordance with a first embodiment of the invention. For simplicity, only the fabrication process of one MOS transistor to be implanted ions is shown and specified.

FIG. 2A illustrates the process of fabricating an MOS transistor (memory cell) on a semiconductor substrate 21. In accordance with the process, first, a gate oxide film 22 and a gate electrode 22 are formed on the semiconductor substrate 21, as shown in FIG. 2A. Impurity ions are then implanted in the semiconductor substrate 21. Due to the formation of impurity diffusion regions, a source region 24-1 and a drain region 24-2 are formed in the semiconductor 21. Thus, the MOS transistor is provided at one side portion of the semiconductor substrate 21.

FIG. 2B illustrates the process of fabricating silicon glass layers on the MOS transistor. First, a USG (undoped silicon glass) layer 25 is deposited over the entire exposed surface of the MOS transistor, as shown in FIG. 2B. Illustratively, the thickness of the USG layer 25 is in a range of about 1,500 Å to 2,000 Å by APCVD (atmospheric-pressure chemical vapor deposition) or PECVD (plasma enhanced chemical vapor deposition). A BPSG (boron phosphorous silicon glass) layer 26 is then deposited over the USG layer 25 by APCVD. A planarization process is performed to planarize the surface of the BPSG layer 26. The planarized BPSG layer 26 is to a thickness of more than 6,000 Å.

Thereafter, the steps for formation of contact holes and metal electrodes (27-1 and 27-2) are performed. The metal electrodes (27-1 and 27-2) are located over the source and drain regions (24-1 and 24-2). A passivation layer 28 is then deposited over the entire exposed surface of the resultant structure. The passivation layer 28 is to a thickness of more than 10,000 Å. Thereafter, formation of a bond pad 29 is performed on the passivation layer 28. The bond pad 29 is located over another portion of the semiconductor substrate 21. The fabrication of the passivated MOS transistor is completed after the formation of the bond pad 29. The resultant structure of the passivated MOS transistor is shown in FIG. 2C.

After an order from client, a ROM code pattern (mask) according to the order is formed on an array of passivated MOS transistors to achieve selective ion implantation into the substrate. In the inventive method, the fabrication of ROM code pattern is formed by etching back the passivation and BPSG layers. The resultant structure with openings due to the etching-back of the passivation and BPSG layers is employed as the ROM code pattern.

As shown in FIG. 2D, the formation of an opening 31 of the passivated MOS transistor of FIG. 2C is illustrated. First, a photoresist layer 30 is formed over the passivated MOS transistor. Next, a selected portion of the photoresist layer 30 according to the ROM code is removed to partially expose the passivation layer 28. The selected portion is located over the selected gate electrode 22. The exposed portion of the passivation layer 28 is then etched through to form opening 31 and to expose portion of the BPSG layer 26 within the opening 31. The exposed portion of the BPSG layer 26 is successively etched to a predetermined remained thickness. The remained thickness of the etched BPSG layer 26 within the opening 31 is employed to form the code identification on the substrate 21. In a preferred embodiment, the remained thickness of the etched-back BPSG layer 26 is set within a range of about 1,500 Å to 2,000 Å.

After the etching back of the BPSG layer to the predetermined remained thickness, the implantation of the ROM code ions 32 is directly performed without the need to form another mask, as shown in FIG. 2E. The ROM code ions 32 is implanting through the opening 31 into the substrate 21 via a medium current implanter. The type of implanted ROM code ions 32 is the same that of impurity ions in source/drain regions. In the invention, the P+ type of ROM code ions 32 are successfully implanted into the substrate 21 via the medium current implanter operating at an energy level of about 100 keV to 150 keV. As to the N+ type of ROM code ions 32, they are successfully implanted into the substrate 21 via the medium current implanter operating at an energy level of about 250 keV to 360 keV. The medium current implanter is operated normally in the energy level of 100 keV to 360 keV.

After the ion implantation, the photoresist layer is removed and a thin passivation layer is then formed on the resultant structure except for the area of the bond pad.

Afterward, an annealing step is performed to activate the implanted ROM code ions and also to recrystallize implanted area of the substrate. The activation of the implanted ROM code ions is by annealing at a temperature within a range of about 420° C. to 550° C. for about 30 minutes in an atmosphere of $N_2$ or $N_2/H_2$ mixture. After the activation of the ROM code ions, an impurity diffusion region 34 is formed in the channel region defined beneath the gate electrode 23, as shown in FIG. 2F.

As a result, the MOS transistor with the impurity diffusion region 23 becomes a transistor operating in the depletion mode, corresponding to information of "1" as described in conjunction with FIG. 1B.

In a second embodiment, to increase the probability of the conjunction of the source and drain regions, a wider opening 35 is formed on the passivated MOS transistor, as shown in FIG. 3. In FIG. 3, the element having the same numeral notations at that in FIGS. 2 is the same structure as recited with regard to FIGS. 2. The formation of the wider opening 35 is by a wider selected portion of the photoresist layer to be removed. The wider selected portion of the photoresist layer is located over the selected gate electrode 23 and the source and drain region (24-1 and 24-2) portions adjacent to the selected gate electrode 23. As a result, a wider impurity diffusion region 34 is achieved, and thereby high fabrication yield is also achieved.

Although the invention is only described in the fabrication of a single MROM shown in FIGS. 2A to 2F, the inventive method is also equally applicable to a case of fabricating an MROM device with an array of MOS transistors. In such a case, a plurality of MOS transistors are formed in the same manner as in FIG. 2A. In the channel region of each selected MOS transistor corresponding to coding with information of "1", ROM code ions according to the client's order are implanted in the same manner as in FIG. 2D. Therefore, impurity diffusion regions 34 are formed in the selected MOS transistors. During the ROM code ion implantation step, no ROM code ion is implanted in the channel region of MOS transistors corresponding to coding with information of "0". The MOS transistors without impurity diffusion region 34 are still maintained in an unprogrammed condition, as in FIG. 2A.

In accordance with the MROM fabrication method of the present invention, it is obvious that the processing time (turn around time) taken in fabricating MROM by the manufacturer after receipt of an order is reduced. Besides, no expensive equipment (high current implanter) is required in the invention. Therefore, the fabrication cost of the inventive MROMs is lower than that of the conventional MROMs.

What is claimed is:

1. A method for fabricating a ROM code pattern on an array of passivated MOS transistors on a semiconductor substrate, each of said passivated MOS transistors comprising a silicon glass overlayer and a passivation overlayer formed over said silicon glass overlayer, said method comprising the steps of:

forming a photoresist layer over said array of passivated MOS transistors and removing selected portions of said photoresist layer to partially expose said passivation overlayer in accordance with a ROM code, the selected portions being located over a corresponding gate electrode;

etching through the exposed portions of said passivation overlayer to form openings and expose portions of said silicon glass overlayer within the openings;

etching the exposed portions of said silicon glass overlayer within the openings such that a remained thickness of said silicon glass overlayer above said corresponding gate electrode remains;

wherein the remained thickness of said silicon glass overlayer within the openings allows ROM code ions to implant into said substrate.

2. The method of claim 1, wherein the ROM code ions are implanted via a current implanter operating at an energy level of about 100 keV to 360 keV.

3. The method of claim 2, wherein the remained silicon glass overlayer comprises a USG (undoped silicon glass) layer with a thickness of about 1,500 Å to 2,000 Å and a BPSG (boron-phosphorous silicon glass) layer with a thickness of about 1,500 Å to 2,000 Å over said USG layer.

* * * * *